United States Patent [19]

Samay et al.

[11] Patent Number: 5,276,406
[45] Date of Patent: Jan. 4, 1994

[54] LOW NOISE WIDE DYNAMIC RANGE AMPLIFIERS

[75] Inventors: Stephen J. Samay, Metuchen; Charles S. Brand, Colts Neck, both of N.J.

[73] Assignee: Trontech, Inc., Eatontown, N.J.

[21] Appl. No.: 837,345

[22] Filed: Feb. 13, 1992

[51] Int. Cl.$^5$ .............................................. H03F 3/16
[52] U.S. Cl. .................... 330/277; 330/295; 330/302
[58] Field of Search ............. 330/277, 286, 294, 295, 330/302, 303, 305, 306

[56] References Cited

U.S. PATENT DOCUMENTS 4,803,443  2/1989  Takagi et al. ............... 330/295 X
5,015,968  5/1991  Podell et al. ............... 330/302 X Primary Examiner—Steven Mottola
Attorney, Agent, or Firm—Robert M. Skolnik

[57] ABSTRACT

Certain GaAs FET devices are employed to accomplish low noise performance and simultaneous high power handling capability, i.e. high dynamic range performance, in an amplifier using larger GaAs FET devices. Such devices are incorporated in different circuit configurations to achieve amplifiers having, simultaneously, a low noise figure, higher input/output intercept performance, higher output power, and improved ruggedness toward high input interfering signals, while not sacrificing other highly desirable terminal characteristics, (i.e. gain, VSWR, etc.).

7 Claims, 3 Drawing Sheets

LOW NOISE WIDE DYNAMIC RANGE AMPLIFIERS

FIELD OF THE INVENTION

This invention relates to low noise wide dynamic range electronic amplifiers.

DESCRIPTION OF THE PRIOR ART

Low noise wide dynamic range amplifiers are used where a desired signal must be detected and amplified in the presence of spurious noise signals. GaAs FET transistors are low noise semiconductor devices and have been employed in low noise, low power amplifiers. Bipolar transistors have also been used in medium and high power amplifiers but these bipolar transistors are not used where low noise performance is required; hence, only low power amplifiers are known in the prior art for low noise applications.

SUMMARY OF THE INVENTION

Noise is a broadband electromagnetic field, generated by various environmental effects and artificial devices. Noise can be categorized as either natural or man-made. Natural noise may be either thermal or electrical in origin. All objects radiate noise as a result of their thermal energy content. This is known a black-body radiation.

Electromagnetic noise is produced by many different man-made devices. In general, any circuit or appliance that produces electric arcing will produce noise.

The level of electromagnetic noise affects the ease with which radio frequency communications can be carried out. The higher the noise level, the stronger a signal must be if it is to be received. The signal-to-noise ratio can be maximized in a variety of ways. The narrower the bandwidth of the transmitted signal, and the narrower the passband of the receiver, the better the signal-to-noise ratio at a given frequency. This improvement occurs, however, at the expense of data transmission speed capability. Circuits such as noise blankers and limiters are sometimes helpful in improving the signal-to-noise ratio. Noise reducing antennas can also be used to advantage in some cases. There is a limit to how much the noise level can be reduced; a certain amount of noise always exists.

This invention is a high power electronic amplifier which has excellent low noise performance which is commensurate with the prior art low noise, low power amplifiers.

Many electronic systems such as radar communications receivers require the capability to receive low level signals in the presence of large spurious signals. Most modern low noise solid state receivers operating in the frequency ranges of VHF through microwave employ GaAs field effect transistors as the input stages of the amplifier chain. These transistors are designed with very fine line geometries which improve the high frequency performance and enhance the inherent low noise characteristics of such devices. An attendant characteristic of GaAs FET (MESFET) designed in this way is that the power handling capability is relatively small. Typical state of the art low noise MESFETs with 0.3 to 0.5 micron gate widths provide low noise operation when biased for a drain current, $I_{ds}$, in the 5 to 15 mA range and a drain to source voltage, VDS, of 2-4 volts. This low level bias condition results in low power handling capability (approximately +5 to +1-dBm for the bias point range specified). One method to improve the low power performance is to parallel a number of such stages thereby splitting the incoming signal to be processed by each cell of the parallel combination. The separately amplified signals are then recombined at the output port of the paralleled transistors. The invention employs such combining to prove that the power handling capability increases by approximately 3 dB each time the number of cells is doubled while the intrinsic noise figure of the combination remains essentially constant. Paralleling devices has limitations due to differences in processing parameters during fabrication. Discrete device parameters such as $g_m$, $V_p$, $I_{dss}$, etc., can vary as much as ±30% from the typical values. These differences cause the bias conditions as well as the RF performance of the various cells of the parallel combination to vary. For optimum performance, each of the cells should be as identical as possible. This can be accomplished by fabricating the parallel configuration in a single chip. Such devices have been fabricated and already exist as commercially available transistors which were designed and intended for use as power amplifiers rather than in low noise applications. The manufacturers do not list noise figure in the specification sheets for such transistors and one would not expect large signal devices to display good low noise performance.

These devices are employed to accomplish low noise performance and simultaneous high power handling capability, i.e. high dynamic range performance. The wide dynamic range performance can be achieved in an amplifier using power GaAs FET devices by incorporating them in any one of the circuit configurations described herein to achieve simultaneously, a low noise figure, higher input/output intercept performance, higher output power, and improved ruggedness toward high input interfering signals, while not sacrificing other desirable terminal characteristics, (i.e. gain, VSWR, etc.).

A principal object of our invention is the provision of a low noise wide dynamic range amplifier. Another object and advantage of our invention is the provision of high power amplifiers which have excellent low noise performance.

BRIEF DESCRIPTION OF THE DRAWINGS

These as well as further objects and advantages of the invention will become apparent to those skilled in the art from a review of the following detailed specification reference being made to the accompanying drawings in which.

DETAILED DESCRIPTION OF THE INVENTION

Figure 1:
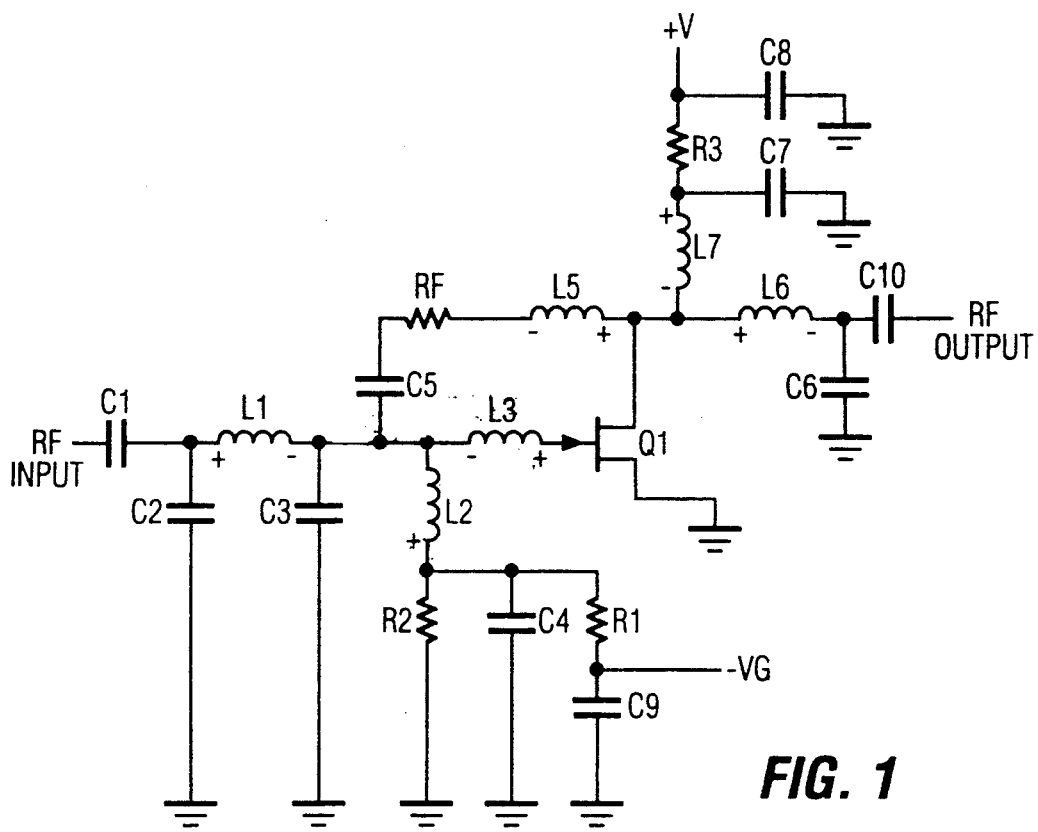
FIG. 1 is a schematic diagram of the circuit of the invention.
Figure 3:
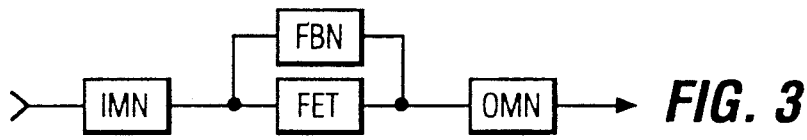
FIG. 3 is a block diagram of a feedback circuit using the schematic of FIG. 1 in another embodiment of the invention.

FIG. 1 is a schematic diagram of one embodiment of the invention employing a GaAs FET, Q1, connected in the configuration shown in FIG. 3. The RF input terminal is coupled to the gate of transistor Q1 via capacitors C1, C2, C3 and inductors L1 and L3. Capacitor C1 serves as a DC blocking capacitor and also provides some impedance matching at low frequencies. Inductor L1 together with capacitors C2 and C3 act as a low pass impedance matching circuit. Inductor L2 can serve as either an RF choke, or an impedance matching element depending on the frequency, and/or the bandwidth requirements.

The connection node "P", at the junction of L1, L3 and C3 also is fed by a voltage divider comprised of resistors R1 and R2 to set the gate to source voltage and thus, the DC operating point of Q1. All inductors may be lumped or distributed depending on the operating frequency range and serve to adjust the gain slope of Q1 and provide for impedance matching.

A feedback network comprised of capacitor C5, resistor Rf, and inductor L5 is connected between node "P" and the junction of inductor L4, L6 and L7. Capacitor C5 is a large value DC blocking capacitor. Resistor Rf and inductor L5 serve to adjust the gain and terminal impedance of the amplifier. In the RF output portion of the circuit, inductor L6 and capacitor C6 serve as a low pass output matching circuit. AC bypass capacitors C4, C9, C7 and C8 are selected in the usual manner. Capacitor C10 is typically selected as a DC blocking capacitor, but can serve as an impedance matching element as well. Resistor R3 sets the DC operating voltage of Q1.

Figure 2:
FIG. 2 is a block diagram of a single stage configuration using the circuit of FIG. 1 according to the invention, with the value of $R_f = \infty$.
Figure 4:
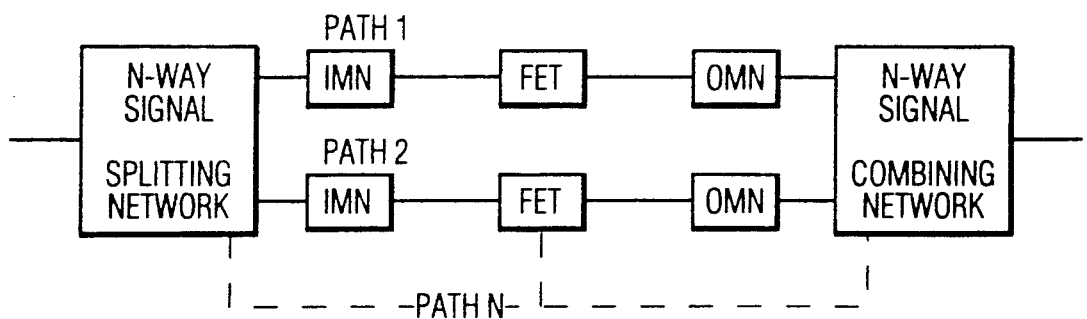
FIG. 4 is a block diagram of a multipath circuit employing the schematic of FIG. 1

Additional circuit configurations are provided in other embodiments of the invention shown in FIGS. 2-4. FIG. 2 shows a single stage implementation. FIG. 3 is a feedback network and FIG. 4 is a multi-path network. In FIGS. 2-4. IMN=input matching network; OMN=output matching network; FET=GaAs FET device; and FBN=feedback network. Examples of such combinations are cascade connection, parallel connection in (N×M) matrix connections. Input and output matching networks IMN and OMN refer to any combination of passive elements (resistors, capacitors, inductors, transformers, transmission line couplers, etc.), or active elements (transistors). Feedback networks can be any combination of circuit elements similar to the aforementioned input matching networks or output matching networks. Location of the connection points of any feedback networks is considered arbitrary and optional; however, in certain applications, such as those shown in FIGS. 1-3, feedback networks are required as a significant part of the circuit scheme needed to realize the full advantage of the invention. The N-way signal splitting and combining networks in FIG. 4 is any combination of passive circuit elements which provide the signal splitting and combining function.

Figure 5:
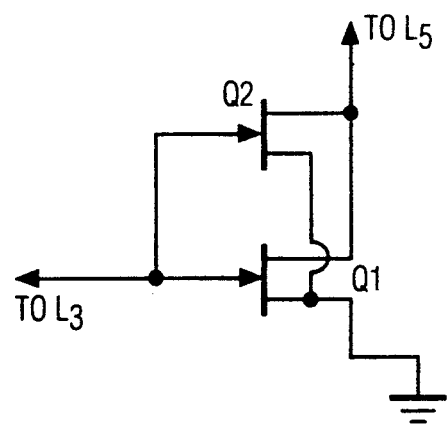
FIG. 5 is a schematic diagram of the circuit of FIG. 1. with active feedback elements.

FIG. 5 is a schematic diagram of the circuit of FIG. 1 with active feedback elements in the circuit. In FIG. 5, a second transistor Q2 is connected in the feedback loop across Q1.

Figure 6:
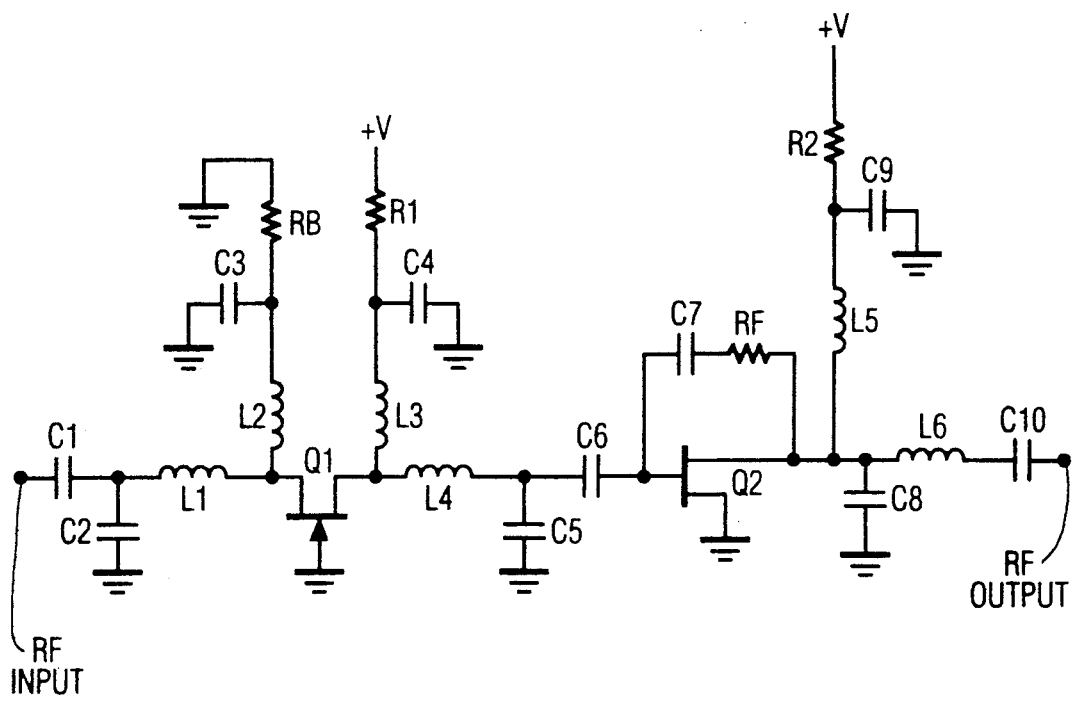
FIG. 6 is a schematic diagram of a circuit which may be employed having an active input impedance matching element.

FIG. 6 is a schematic diagram of a circuit which may be employed having an active input impedance matching element. The following table described the circuit elements of FIG. 5:

| ELEMENT | FUNCTION |
|---|---|
| C1 | DC BLOCKING CAPACITOR |
| C6 | " |
| C7 | " |
| C10 | " |
| L1 | INPUT MATCHING |
| C2 | " |
| L4 | INTER STAGE MATCHING |
| C5 | " |
| C8 | OUTPUT MATCHING |
| L6 | " |
| L2 | RF BLOCKING CHOKE |
| L3 | " |
| L5 | " |
| C3 | RF BYPASS |
| C4 | " |
| C9 | " |
| RB | SOURCE SELF-BIAS RESISTOR |
| R1 | DRAIN BIAS RESISTOR (Q1) |
| RF | Q2 FEEDBACK RESISTOR |
| R2 | DRAIN BIAS RESISTOR (Q2) |
| Q1 | ACTIVE INPUT IMPEDANCE TRANSFORMER |
| Q2 | GaAs FET amplifier akin to Q1 of FIG. 1 |

The following are examples of circuits constructed in accordance with our invention:

EXAMPLES

| | EXAMPLES | | |
|---|---|---|---|
| | 1 | 2 | 3 |
| C1 | 0 | 100 pf | 1000 pf 470 pf |
| C2 | 2 pf | 0 | 6.8 pf |
| C3 | 0 | 0 | 0 |
| C4 | 100 pf | .01 uf | 1000 pf |
| C5 | 10 pf | .10 uf | 1000 pf |
| C6 | 0 | 0 | 1 pf |
| C7 | 100 pf | .01 uf | 1000 pf |
| C8 | .1 uf | .1 uf | .1 uf |
| C9 | .01 uf | .1 uf | .1 uf |
| C10 | 100 pf | 1000 pf | 33 pf |
| L1 | 0 | 8 nH | 18 nH |
| L2 | 5 nH | 10K ohms | 25 nH |
| L3 | P.L. .2" L × .1" W | P.L. .3" L × .1" W | P.L. .2" L × .1" W |
| L4 | 0 | P.L. .2" L × .1" W | P.L. .2" L × .1" W |
| L5 | 22 nH | 24 nH | 22 nH |
| L6 | 3 nH | 1:2 transformer | 1:4 transformer |
| L7 | 3.5 nH | .22 uH | 18 nH |
| R1 | 10K ohms | 10K ohms | 10k ohms |
| R2 | select @ test | select @ test | select @ test |
| Rf | 10K ohms | 330 ohms | 750 ohms |
| R3 | 20 ohms | 6.5 ohms | 13 ohms |
| −Vg | −5V | −5V | −5V |
| +V | 12 V | 12 V | 12 V |
| ELECTRICAL PERFORMANCE ACHIEVED | | | |
| Freq. | 1025-1150 MHz | 60-100 MHz | 400-625 MHz |
| Gain | 15 dB | 16 dB | 17 dB |
| Noise Figure | 1.9 dB | 2.0 dB | 1.7 dB |
| VSWR (in/out) | 2.0:1 in/out | 1.5:1/1.7:1 in/out | 2.0:1 in/out |
| Pwr. Output | +24 dBm | +28 dBm | +29 dBm |
| 3rd Order Intercept Point | +36 dBm | +40 dBm | +41 dBm |

Typical characteristics of GaAs FET devices used in the above examples are:

| | |
|---|---|
| Max. drain - source voltage (Vds) | 12-17 V |
| max. power dissipation (watts @25° C.) | 4-8 W |
| Saturated drain current (Idss) | .25 minimum |
| Max. gate-source voltage (Vgs) | −5 V |

-continued

| | |
|---|---|
| Transconductance (gm) | 120-350 mS |
| Pinch-off voltage | −1 to −5 V |

The upper ranges for the GaAs FET devices set forth above are not limiting but may increase by 50% from the values in the table above.

As modifications to the invention may be made without departing from the spirit and scope of our invention, what is sought to be protected is set forth in the appended claims.

We claim:

1. An electronic amplifier having low noise performance and simultaneous high power handling capability comprising: an input terminal and an output terminal, input impedance matching means connected to said input terminal for matching the impedance at said terminal to said amplifier; a GaAs FET transistor device connected to said input impedance matching means for amplifying the signal at said input terminal, and output impedance matching means connected to said GaAs FET transistor device and to said output terminal for matching the impedance at said output terminal to said GaAs FET transistor device; said GaAs FET transistor device having the following characteristics:

| | |
|---|---|
| Max. drain - source voltage (Vds) | 12-17 V |
| max. power dissipation (watts @25° C.) | 4-8 W |
| Saturated drain current (Idss) | .25 minimum |
| Max. gate-source voltage (Vgs) | −5 V |
| Transconductance (gm) | 120-350 mS |
| Pinch-off voltage | −1 to −5 V | where the upper value of each of said characteristics having an upper value may vary by an amount between 0% and 50% of said upper value; and said input impedance matching means and said output impedance matching means each including an active circuit element.

2. The amplifier of claim 1 further including feedback network means connected across said GaAs FET transistor device for adjusting the gain and impedance level of said GaAs FET transistor device.

3. The amplifier of claim 1 wherein said input impedance matching means and said output impedance matching means includes passive circuit elements.

4. The amplifier of claim 2 wherein said feedback network means includes passive circuit elements.

5. The amplifier of claim 2 wherein said feedback network means includes active circuit elements.

6. An electronic amplifier circuit having low noise performance and simultaneous high power handling capability comprising: an input terminal and an output terminal, input signal splitting means connected to said input terminal for splitting said input signal into a plurality of signals; input impedance matching means connected to said input signal splitting means for each of said plurality of signals for matching the impedance at said input signal splitting means to a GaAs FET amplifier means; GaAs FET amplifier means connected to each of said input impedance matching means for amplifying the signal at said input impedance matching means, output impedance matching means connected to each of said GaAs FET amplifier means for matching the impedance at each of said GaAs FET amplifier means to an output signal combining means; output signal combining means connected to each of said output impedance matching means and to said output terminal for recombining said signal; said GaAs FET amplifier means having the following characteristics:

| | |
|---|---|
| Max. drain - source voltage (Vds) | 12-17 V |
| max. power dissipation (watts @25° C.) | 4-8 W |
| Saturated drain current (Idss) | .25 minimum |
| Max. gate-source voltage (Vgs) | −5 V |
| Transconductance (gm) | 120-350 mS |
| Pinch-off voltage | −1 to −5 V. |

7. The amplifier of claim 6 wherein said input signal splitting means and said output signal combining means include passive circuit elements.

* * * * *